United States Patent [19]

Kasten et al.

[11] Patent Number: 5,221,903

[45] Date of Patent: Jun. 22, 1993

[54] METHOD FOR THE DETERMINATION OF VERY SMALL MAGNETIC SUSCEPTIBILITIES AND PROBEHEAD FOR A HIGH RESOLUTION NMR SPECTROMETER FOR THE PURPOSE OF CARRYING OUT THE METHOD

[75] Inventors: Arne Kasten; Reinhard Biehl, both of Karlsruhe, Fed. Rep. of Germany

[73] Assignee: Bruker Analytische Messtechnik GmbH, Rheinstetten-Forchheim, Fed. Rep. of Germany

[21] Appl. No.: 771,166

[22] Filed: Oct. 3, 1991

[30] Foreign Application Priority Data

Oct. 10, 1990 [DE] Fed. Rep. of Germany ....... 4031994

[51] Int. Cl.⁵ .......................................... G01R 33/20
[52] U.S. Cl. ................................... 324/321; 324/318
[58] Field of Search ............... 324/300, 307, 318, 322

[56] References Cited

U.S. PATENT DOCUMENTS

| | | | |
|---|---|---|---|
| 4,087,738 | 5/1978 | Van Degrift et al. | 324/322 |
| 4,728,892 | 3/1988 | Vinegar et al. | 324/309 |
| 5,111,146 | 5/1992 | Jerome et al. | 324/318 |

FOREIGN PATENT DOCUMENTS

3314926A1 4/1983 Fed. Rep. of Germany.

Primary Examiner—Michael J. Tokar
Attorney, Agent, or Firm—Cesari and McKenna

[57] ABSTRACT

An NMR spectrometer is utilized in order to determine the magnetic susceptibility of a sample, in which, by means of the sample, a change in the homogeneous magnetic field in the region of a probe substance is effected and the change in the spectrum of the probe substance which is thereby caused is observed. A method known in the art is based on the modulation of the resonance frequency which occurs when the probe substance is caused to rotate about an axis perpendicular to the direction of the magnetic field. The application of this method encounters difficulties with spectrometers whose probe volume is penetrated axially by the magnetic field. In accordance with the invention, by means of the sample (14), a change is produced in the magnetic field along the probe axis in a sample substance (12) preferentially positioned along the direction of the magnetic field. This change effects a structuring of the resonance line with maxima whose distance is directly proportional to the susceptibility of the sample substance. A proportionality factor is dependent (upon the geometry of the sample (14). Preferentially a fluid in a double walled tube (11, 13) is utilized as probe substance (12) upon whose outer side is positioned a ring shaped sample (14) of the material to be examined.

23 Claims, 4 Drawing Sheets

METHOD FOR THE DETERMINATION OF VERY SMALL MAGNETIC SUSCEPTIBILITIES AND PROBEHEAD FOR A HIGH RESOLUTION NMR SPECTROMETER FOR THE PURPOSE OF CARRYING OUT THE METHOD

FIELD OF THE INVENTION

The invention concerns a method for the determination of very small magnetic susceptibilities with which a sample of the substance whose magnetic susceptibility is to be determined together with a probe substance whose NMR spectrum is known are brought into the measurement region of a high resolution NMR spectrometer in which a constant homogeneous magnetic field is established and in which a HF resonance system for the excitation of the probe substance and for the detection of the excited signals is located in such a manner, that the probe substance is subjected to the detection region of the high frequency resonance system whose magnetic field is modified by the susceptibility of the sample, that the spectrum of the sample substance is taken and that, finally, from the probe substance spectral changes resulting from the susceptibility of the sample the magnetic susceptibility of the sample is determined.

DESCRIPTION OF THE PRIOR ART

Such a method is known in the art from DE-OS 32 16 309 and DE-OS 33 14 926. In these methods known in the art the sample whose susceptibility is to be determined is located in a sample tube which is surrounded by a hollow cylinder or torus filled with the probe substance. The sample tube with the sample and its surrounding probe substance are arranged in a constant homogeneous magnetic field of a high resolution NMR spectrometer in such a manner that the axis of the sample tube and the jacket formed by the probe substance surrounding the sample are arranged perpendicular to the axis of the homogeneous magnetic field. Furthermore, the sample and the probe substance are rotated about their axes with the usual revolution rate of a high resolution NMR spectrometer. In the configuration described, as a result of this rotation and of the inhomogeneity of the magnetic field caused by the sample, side bands are produced at a separation of twice the rotation frequency in the spectrum of the probe substance the intensity of which provide a measure of the deviation of the susceptibility of the sample from the susceptibility of the probe substance.

A disadvantage of this method is that the axis of the sample tube is perpendicular to the direction of the homogeneous magnetic field of the NMR spectrometer and must rotate about this axis. Modern high resolution NMR spectrometers, in particular those with superconducting magnets, are, however, set up to accept sample tubes whose axes are directed parallel to the direction of the magnetic field. The method known in the art can therefore not be executed utilizing such NMR spectrometers.

A further disadvantage of the method known in the art is that the susceptibility determines the intensity of the side band lines which are located at a distance from the main line equal to twice the rotation frequency so that the intensity of these lines must be quantitatively determined in order to determine the susceptibility. Since the accuracy of the determination of a line intensity is quite limited the corresponding accuracy of the susceptibility determination is likewise limited. The method known in the art also suffers from the fact that certain limiting conditions for the susceptibility measurement system including those of the sample vessel and those of the rotation frequency must be observed. Furthermore the disturbing influence of the sample vessel itself must be quantitatively taken into consideration. All of these conditions make the analysis of the obtained spectrum and thereby the determination of the susceptibility very difficult. Nevertheless, it is not even possible with the method known in the art to determine the sign of the deviation of the susceptibility of a sample from the susceptibility of the probe substance since positive and negative differences effect the same modulation change.

The underlying purpose of the invention is therefore to provide a method of the above mentioned kind which allows for measurement of the magnitude and sign of small magnetic susceptibilities and is applicable utilizing NMR spectrometers of modern construction in which the sample is usually located in a container whose axis is parallel to the static homogeneous magnetic field.

BRIEF SUMMARY OF THE INVENTION

This purpose is achieved in accordance with the invention in that the probe substance is arranged in the measurement region in the shape of a column and the sample is arranged next to this column, and that the modification of the magnetic field extends over a section of this column effecting a broadening of the structure of the resonance line of the probe substance which provides, as a function of the position and the size of the sample, a measure of the susceptibility of the sample substance and that, utilizing this broadening and structuring of the resonance line, the susceptibility of the sample substance is determined.

Such a local perturbation leads, in NMR spectrometers, to the appearance of lines which exhibit, on one side, a widened base with a relatively sharp cut-off edge which is described as a "hump". The invention takes adgantage of this phenomenon in that a perturbation is intentionally introduced which leads to the appearance of a hump whose width and position with respect to the main line is characteristic of the magnitude and sign of the susceptibility of the sample. Even though the structure and broadening of the resonance line depend on the shape and configuration of the sample, the sample nevertheless always effects, with respect to its position, a largely symmetric field change along the probe substance arranged in the direction of the magnetic field the maximum, of which occurs at the sample position which leads to a defined maximum in the structure of the resonance line of the probe substance, namely the hump. It is easy to evaluate this maximum and to determine the susceptibility of the sample with high precision. At this point we note that the word "sample" describes the body whose magnetic susceptibility is to be determined in contrast to which the substance which delivers the resonance line is described as the "probe substance".

The field perturbation which leads to this structuring of the line always leads to a uniquely distinguishable maximum when the field distribution along the axis of the probe substance has a unique extremum, that is to say, when the field strength maximum or minimum is exposed to a larger volume element of the probe substance.

This condition is particularly well fulfilled when the sample is a ring surrounding but being separated from the probe substance column. The radial change of the field strength is negligible if the diameter of the ring is significantly larger than the diameter of the column formed from the probe substance. In any event unique results are obtained when the diameter of the ring is at least twice the diameter of the column of the probe substance and, in the direction of the magnetic field, the cross section of the ring material has an extent which is less than a quarter of the ring diameter.

A sample fluid can be utilized as a probe substance as is preferentially the case in the above mentioned hump test. In this event a solution of up to 50% chloroform and 1% TMS (tetramethylsilane) in acetone-d6 is utilized whose proton line is monitored.

Although it may not, in principal, be necessary in order to carry out the method in accordance with the invention, it is thereby nevertheless useful to rotate the probe substance about its lengthwise axis during spectrum accumulation in order to average out magnetic field inhomogeneities in the plane perpendicular to the axis of the probe substance so that these inhomogeneities do not overlap the artificially produced inhomogeneity in the direction of the magnetic field.

In accordance with the invention a probe tube with a probe substance whose spectrum is known is brought into the probehead of a high resolution NMR spectrometer and the sample whose susceptibility is to be determined is arranged next to the probe tube. In principle it is possible to carry out the procedure according to the invention with every conventional NMR spectrometer whereby the sensitivity and the resolution capability determine the sensitivity with respect to the lower bound of the measurable susceptibility. Such an NMR spectrometer exhibits a probehead which is usually equipped with a probe tube and an HF resonance system surrounding said probe tube. Thereby one takes into consideration that in the vicinity of the HF sensitive region that is to say the volume in which the HF resonance system radiates and from which appreciable NMR signals are received, all materials utilized are homogeneous and largely rotationally symmetric and have appreciable extent in the field direction. This is particularly also applicable to the probe fluid and the probe, sample, and HF tubes. Only then do the necessarily likewise weakly magnetic materials from which these construction components are formed exhibit negligibly small or at least shim system compensatable magnetic field distortions.

In the probehead utilized in carrying out the method in accordance with the invention, it is necessary that the separation between the probe tube and the HF resonance system be large enough to accommodate, therein between, the sample whose susceptibility is to be determined. Towards this end the diameter of the probe tube can be reduced and/or the diameter of the HF resonance system can be increased. The utilization of a probe tube with a very small diameter has the advantage that the probe substance is largely limited to the region of the axis of the HF resonance system and the changes in the magnetic field caused by the sample in the radial direction are only quite small and are negligible with respect to the changes in the direction of the magnetic field.

Particularly unique results can be achieved when the sample is a ring surrounding but being separated from the probe tube and is arranged in the mid-plane of the HF resonance system which is largely perpendicular to the magnetic field. Thereby the diameter of the ring of sample material should be at least twice as large as the diameter of the probe substance. Furthermore, with electrically conducting sample substances, the ring of sample material can exhibit at least one axial slit so that no ring shaped closed eddy currents can form. Finally the probehead can exhibit in a conventional manner, a device for rotation of the probe tube about its lengthwise axis.

Further details and manifestations of the invention can be extracted from the following description of the embodiment represented in the drawing. The characterizing features which can be extracted from the description and the drawing can find application in other embodiments of the invention either individually or collectively in arbitrary combination. Shown are:

DETAILED DESCRIPTION OF THE PREFERRED EMBODIMENTS

Figure 1:
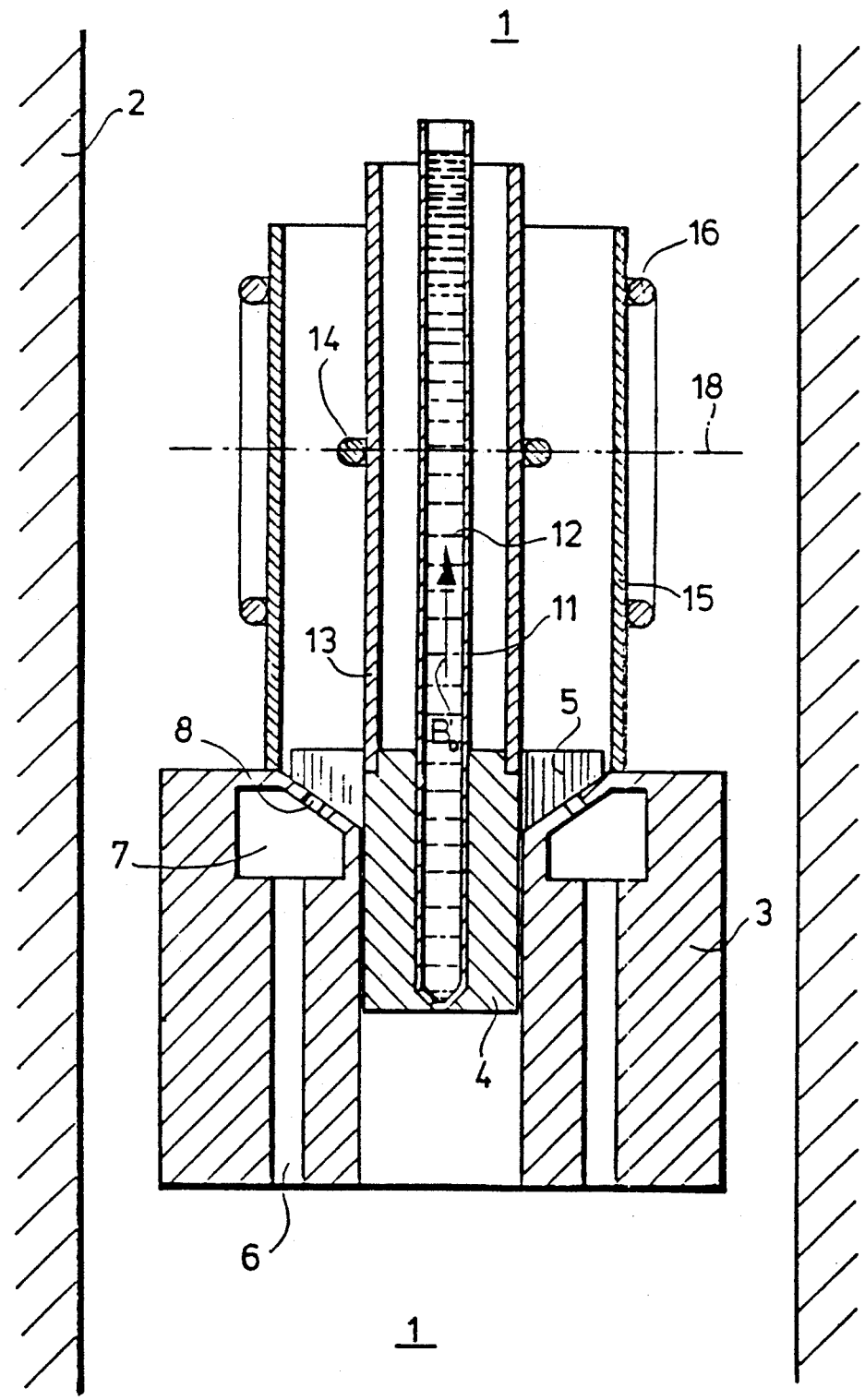
FIG. 1 the schematic representation of a probehead for a high resolution NMR spectrometer to carry out the method in accordance with the invention, FIG. 2 the proton resonance line of the probe fluid utilized in the probehead according to FIG. 1, FIG. 3 a diagram reproducing the change in the magnetic field strength along the axis of the probehead according to FIG. 1, FIGS. 4 and 5 the broadening of the proton resonance line of the probe fluid of the probehead in accordance to FIG.1 resulting from the investigation of samples from copper and platinum and FIG. 6 the proton resonance line according to FIG. 5 resulting from the investigation of a platinum sample in a 5-fold magnified scale.

The probehead schematically represented in FIG. 1 is located in a vertical sample region 1 of a cryomagnet only the wall 2 of which is schematically indicated. It surrounds a support body 3 in which a rotor 4 is seated in a rotatable fashion which, on the end projecting out of the support body 3, supports a turbine wheel 5. Air channels 6,7 and 8 are located in the support body 3 by means of and through which the turbine wheel 5 can be blown in order to cause a rotation of the rotor 4 about its lengthwise vertical axis.

A central probe tube 11 is attached in the rotor 4 which contains a probe substance 12. The probe tube 11 is concentrically surrounded by a first support tube 13 over which a ring shaped sample 14 is fitted which is comprised of the material whose susceptibility is to be determined. Furthermore a second support tube 15, attached to the support body 3, concentrically surrounds the probe tube 11 and the first support tube 13 and carries the HF resonance system 16 of the probehead which, in the usual fashion, can exhibit a saddle coil attached to the outside of the second support tube 15. The HF resonance system 16 is, in the conventional and therefore not further described fashion, connected to the HF sender and HF receiver devices of a high resolution NMR spectrometer. Clearly, the probe and support tubes are represented exaggeratedly foreshortened and can also be arranged on the rotor in a hanging fashion.

In the sample space 1 of the cryomagnet, in the region contained within the HF resonance system 16, is a homogeneous magnetic field of field strength $B_0$ to which the probe substance in the probe tube 11 is exposed. The susceptibility of the probe and the support tubes do not affect the constant quality of the magnetic field in the measurement region because they are configured in a rotationally symmetrical fashion and their axial length is large relative to the measurement region. A perturbation can however be caused by the cross-running sections of the HF resonance system 16, however, such a perturbation remains in consequence of the small diameter of the probe tube relative to the diameter of the HF resonance system, negligibly small for a well-compensated susceptibility of the wires from which the HF resonance system is made. Small field homogeneities perpendicular to the direction of the magnetic field are averaged out in the usual fashion through sample rotation.

Figure 2:
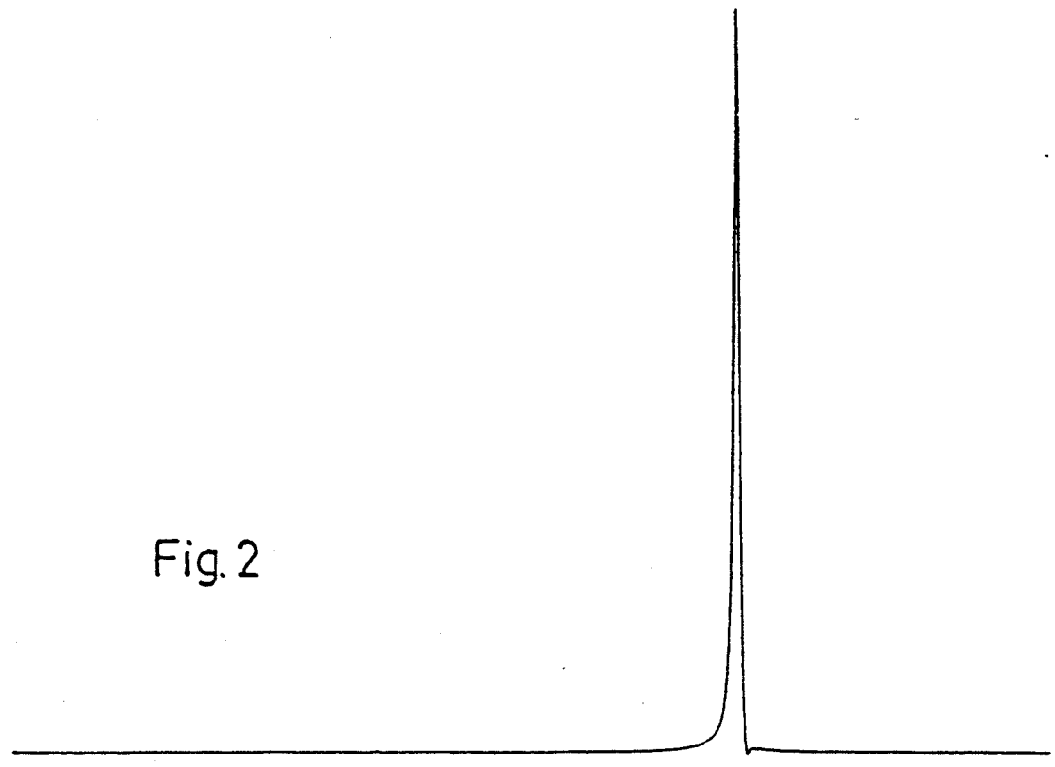

FIG. 2 shows, by means of a calibration measurement, the proton lines of the probe substance 12 in the probe tube 11 which were obtained with a high resolution NMR spectrometer of the applicant of the type AM 400 with a magnetic field $B_o = 9.4$ T and a resonance frequency of 400 MHz. The probe substance is a solution of 50% chloroform and 1% TMS (tetramethylsilane) in acetone-d6. The width of the proton line in FIG. 2 assumes a value relative to the resonance frequency of $\Delta f/f_o = 10^{-9}$.

Figure 3:
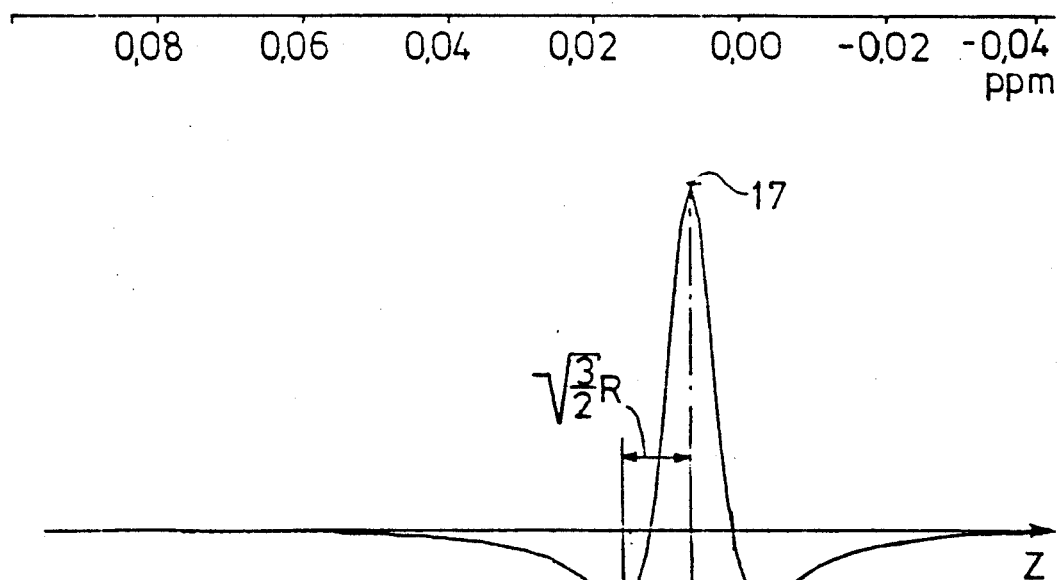

If a ring 14 from a material exhibiting a magnetic susceptibility different from the surroundings is introduced, as represented in FIG. 1, into the probehead, then such a ring effects a change in the magnetic field strength along the axis of the probe tube 12 as qualitatively represented in FIG. 3. In FIG. 3 the deviation of the magnetic field strength from the field strength $B_0$ of the homogeneous magnetic field is plotted along the axis of the probe tube 12 labeled as the z-axis. In this manner a pronounced maximum 17 in the deviation of the field strength occurs in the middle plane 18 of the sample ring 14 which goes over into minima 19 on either side.

It is clearly understandable that the deviation of the field strength caused by a ring-shaped body 14 must be symmetric with respect to the middle plane 18 of the ring and that the maximum 17 and the minimum 19 effect an upper and a lower resonance frequency which lead to a corresponding broadening of the resonance line. Thereby, to first order, the line broadening is independent of the geometric form of the sample and is instead dependent on the magnetic field change in the region of the probe substance 12. Thereby, the radial field distribution within the probe substance 12 also plays a role. In order to obtain as unique relationships as possible it is necessary that the radial extent of the probe substance be as small as possible and that the sample 14 be located at a sufficiently large separation from the probe substance. These conditions are well fulfilled if the radius of the probe substance 12 assumes a value of less than half the distance of sample 14 from the axis of the probe substance 12 and when the axial extent of the sample is small relative to the separation of the sample from the probe substance. In a respective experimental prototype, one used a probe tube of 2 mm inner diameter and a 5 mm inner diameter ring-shaped sample. Thereby, a normal commercial double wall sample tube, type 518 from the company Wilmad, was utilized in the inside of which the probe substance was introduced and upon whose outer wall the sample ring was arranged. The axial extent of the ring-shaped sample assumed a value of less than 1 mm.

When examining the field distribution represented in FIG. 3 one should take into consideration that the magnitudes of the extreme values do not influence the intensity of the resonance lines but instead determine the magnitude of the frequency deviation. Thereby, due to the gyromagnetic ratio which determines the resonance frequency of the spin momenta, the frequency deviation $\Delta f$ relative to the average frequency $f_o$ is equal to the deviation $\Delta B$ of the magnetic field strength with respect to the strength $B_o$ of the homogeneous magnetic field, that is to say $\Delta f/f_o = \Delta B/B_o$. It is thereby significant for the line broadening caused by the magnetic field change that the magnetic field given by the middle maximum influences only a small fraction of the probe substance so that the corresponding line portion exhibits only a small intensity which, however, is relatively far removed from the main $B_o$ line in contrast to which the fraction of the probe substance in the region of the minima 19 is significantly larger and therefore gives a line portion of large intensity which, however, due to the smaller value of the minima is more closely positioned to the main line. Accordingly, one can expect a line shape which exhibits two closely separated neighbouring portions of relatively large intensity and a further separated portion of lower intensity. A kind of double line with a widened base therefore occurs which corresponds to the earlier observed hump discussed above. Thereby the position of the hump relative to the main portion of the line determines the sign of the susceptibility accordingly immediately determining whether or not the sample under study is paramagnetic or diamagnetic.

For a ring-shaped sample of radius R which is composed of a cross sectionally circular wire of radius r and a material of susceptibility $\chi$ one obtains the following equation for the variation of the magnetic field strength in the axial direction z of the sample substance where $z = 0$ is the symmetry plane of the sample ring given by $$\frac{\Delta B}{B_0} = \chi \frac{\pi}{2} \frac{r^2}{R} \frac{2(z/R)^2 - 1}{[1 + (z/R)^2]^{5/2}}$$

This equation yields the curve represented in FIG. 3. Thereby the maximum 17 is necessarily located at the position $z = 0$ and the minima are located at the positions $z = \pm \sqrt{3}/2$ R. If one introduces these values into the above equation and takes into consideration, as discussed above, that $\Delta f/f_o = \Delta B/B_o$ then one obtains a form factor W as a function of the dimensions of the ring which immediately gives the relationship between the frequency deviation $\Delta f/f_o$ and the susceptibility $\chi$ of the sample namely $\chi = W \Delta f/f_o$.

As already mentioned, the formal analytic relationship described above is only exact for the z dependence of the field deviation along the symmetry axis of the assembly and for negligibly small cross section of the ring material, that is for small radius r. The field distribution in the entire probe volume responsible for the structuring of the resonance line is not exactly analytically representable, but can be numerically calculated to sufficient accuracy. Towards this end one subdivides the sample and the probe in small volume elements and calculates at the position of a volume element of the probe the magnetic dipole field caused by all the volume elements of the sample. One does this for all volume elements of the probe which contribute to the HF signal. One thereby obtains a set of field values corresponding to the displacement of the resonance frequency in the volume elements. One obtains the structure change in the originally extremely sharp resonance line caused by the sample, by plotting the number of volume elements whose frequency displacement fall within a certain frequency interval as a function of frequency.

Figure 4:
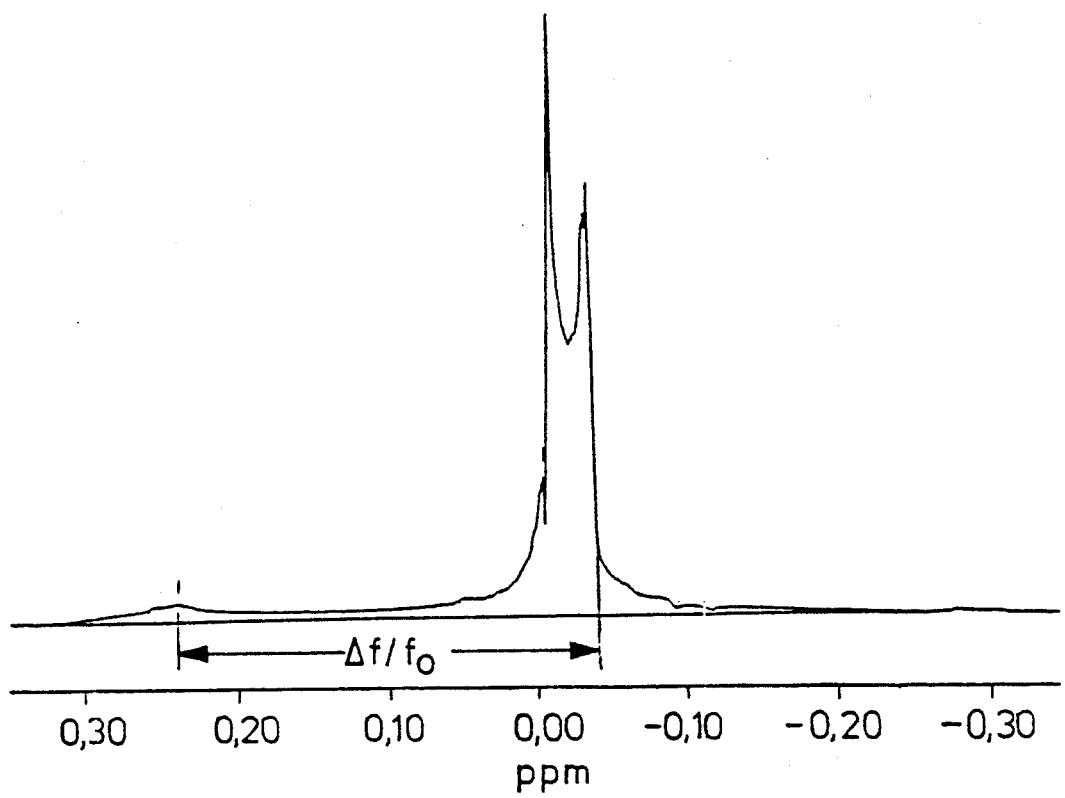
Figure 5:
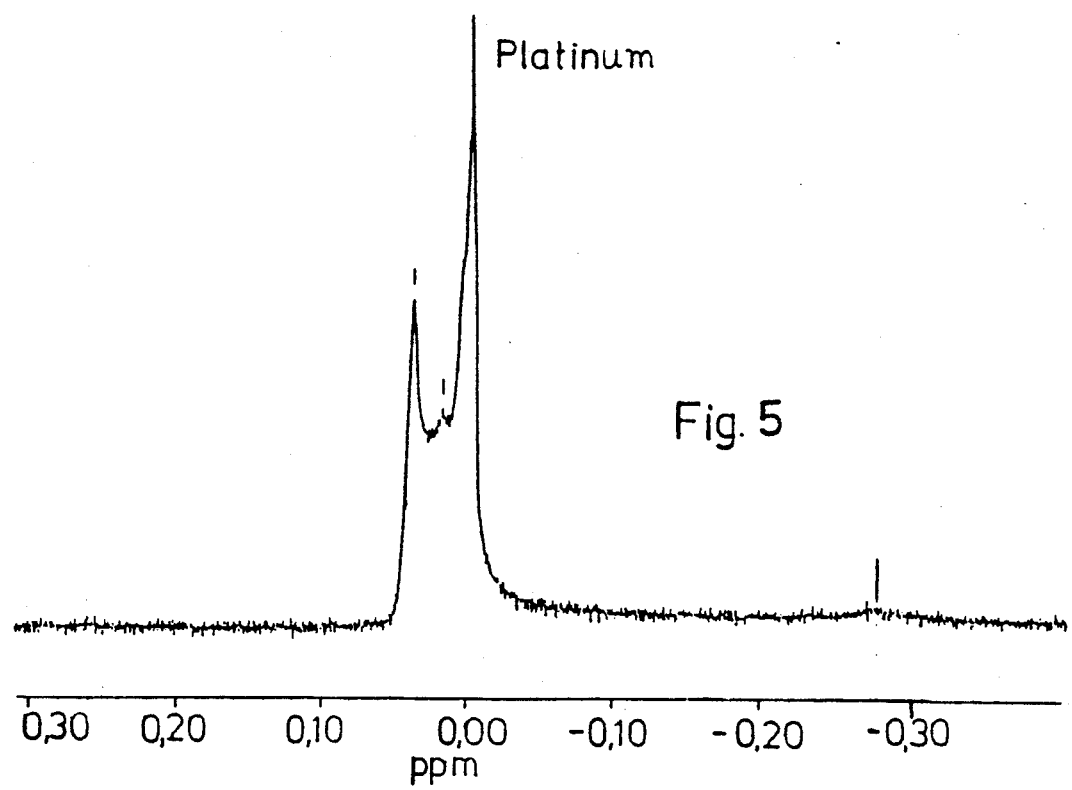
Figure 6:
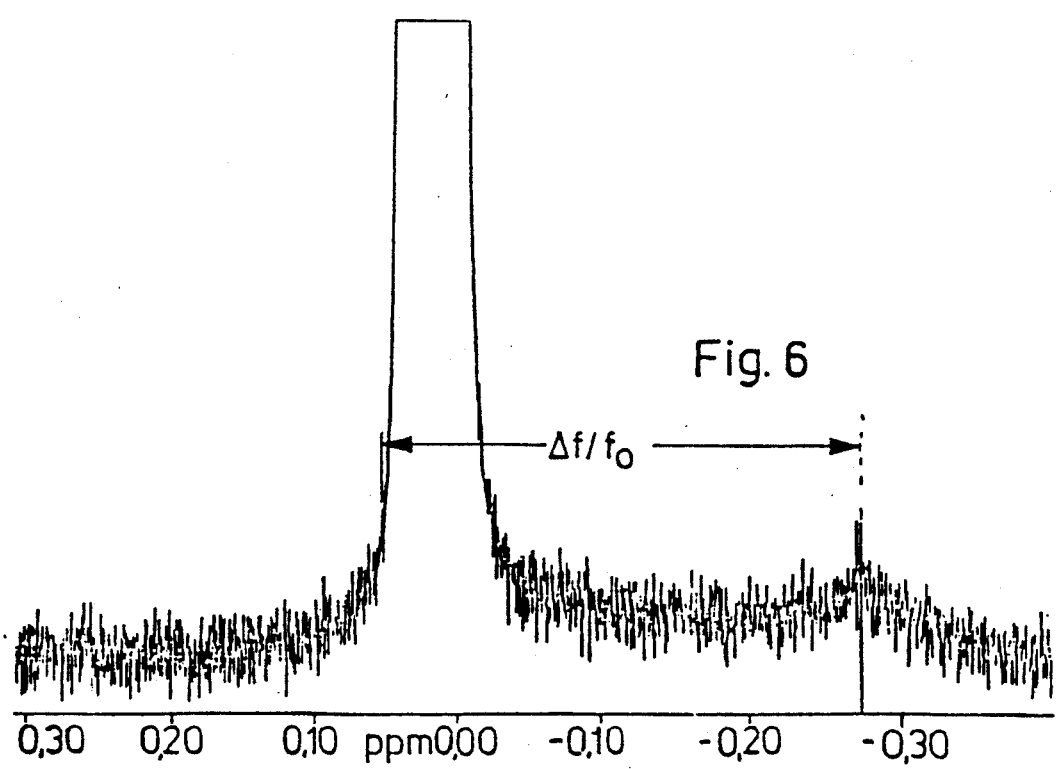

It turns out that, for a ring sample, the frequency displacement of the maximum which corresponds to the ring center (see FIG. 3) is significantly larger as soon as one, within the plane of the ring, goes away from the center that is to say that there are still larger frequencies displacements than those corresponding to the ring center when the finite radial extension of the probe is taken into consideration. For this reason, this radial extension should remain limited to at most half of the inner radius of the ring. In this case the probe regions which are largely in the plane of the ring lead to a hump whose intensity does not cut off sharply at larger frequency displacements but whose intensity maximum is still given by the frequency displacement in the center of the sample ring. Such a method is shown in FIGS. 4 through 6.

The field strength minima in FIG. 3 are significantly flatter than the central maximum. They therefore lead to an additional line which is significantly more intense and clearly closer to and on the other side of the main line than the hump. The radial dependence of the minima is also significantly flatter so that one obtains a quite sharp cut-off edge as long as the radial extent of the sample remains sufficiently small. Both minima of FIG. 3 lead to a common line since they both correspond to the same frequency displacement. An additional splitting into two lines would only be expected if the sample (ring) exhibited lack of symmetries with respect to its central plane.

The main line ultimately stems from the regions of the probe which are relatively far removed from the perturbation caused by the sample. In this region the interfering field approaches zero asymptotically. Therefore the main line is also asymmetrically widened.

The intensity ratios of the essentially three line portions depend on the susceptibility, the size and the shape of the sample, the diameter of the probe as well as on the extension of the HF sensitive region which, in turn, is determined by the size and shape of the HF resonance structure. If one observes the boundary conditions that the sample only extends a small amount in the field direction (z) and the ratio of the diameters of the HF coil to the sample ring and to the probe fluid are larger than approximately 4:2:1, one can obtain the susceptibility of the sample ring directly from the separation between the maximum of the hump to the cut-off edge of the line across from the main line in that one equates this separation $f/f_o$ to the separation $$\Delta B/B_0 = \chi \frac{\pi}{2} \frac{r^2}{R} \quad 1,202$$

between the maxima and the minima in FIG. 3 or equation 1.

Although the above considerations are particularly clear and mathematically easy to handle for the case of a ring-shaped sample, geometric configurations which deviate from this are also within the purview of the invention. It is only important that one is dealing with a local confined field perturbation which leads to a structuring of NMR lines in particular to a splitting from which the susceptibility of the sample can be qualitatively and quantitatively determined. Configurations are conceivable with which there is no rotational symmetry, by way of example, a pointed object. The local perturbation can also be effected from the end of an effectively semi-infinite hollow cylinder. A wire can even be continuously lead past the probe tube whereby the field perturbations will be largely caused from portions of the wire which are, in certain regions, located perpendicularly to the field. In this manner continuous measurements are possible.

In principle the axis of the sample tube can also be arranged perpendicular to the field although the advantage of the rotational symmetry about the field axis is thereby lost.

By way of example a ring from copper was evaluated which was comprised of a wire with 0.7 mm diameter and was positioned around a support tube of 5 mm of diameter. This ring was slit in order to prevent eddy currents. Accordingly for this ring R=2.85 mm and r=0.35 mm. The resulting value for the mentioned factor W is given by W=35.12. As can be seen from FIG. 4 the probe substance as represented in FIG. 4, experiences, upon introduction of the copper ring, a splitting $\Delta f/f_o=0.277\times10^{-6}$ leading to a susceptibility of $9.73\times10^{-6}$ which is in good agreement with the value found in the literature of $9.68\times10^{-6}$. This material, as can easily be seen from the position of the hump, is diamagnetic.

FIG. 5 and 6 show the line splitting for the case of a platinum ring. However, in this case, the ring is not comprised of a wire with circular shaped cross section but, instead, is a band with a width of 0.254 mm and a thickness of 0.051 mm. For this dimensioning of the ring, by means of a calculation analogous to the calculation described above for a wire ring of circular cross section, a form factor, with which the line splitting is to be multiplied in order to determine the value of the susceptibility, of value W=823 results. Although the hump maximum appears only slightly noticeable for the ordinate scale utilized in FIG. 5, an enlargement of the amplitude in accordance with FIG. 6 allows the maximum of the hump to be clearly seen. Accordingly there is a splitting of the probe substance lien of $\Delta f/f_o=0.323\times10^{-6}$. Multiplying with the above mentioned form factor W leads to a susceptibility of $266\times10^{-6}$ which is in good agreement with the accepted value for platinum of 278.9. Thereby the position of the hump at a frequency which is lower than the frequency of the main line shows that platinum is a paramagnetic material.

It can be clearly seen that the precision of the method in accordance with the invention depends to a large extent on the precision with which the dimensions and the position of the sample body being used for the measurement can be determined and the influence of the sample body upon the magnetic field can be calculated. On the other hand it is also clear that the shape of the sample body is not important rather only that the sample effects a change in the magnetic field along the z axis which leads to a structuring or splitting of the line. Clearly, for practical measurements it is reasonable to utilize a sample form with which the sample can be reproducibly manufactured in a simple fashion and whose influence is easily calculated. Towards this end, a ring structure is particularly advantageous. Thereby, the cross section of the ring can be tailored to the material being examined. As already mentioned, with electrically conducting material, it is advantageous to slit the ring in order to reduce eddy current induction in the ring.

The above mentioned embodiments also have clearly indicated that the method in accordance with the invention can be utilized with conventional high resolution NMR spectrometers whose probehead need only be modified in such a manner that within the HF resonance structure, in addition to a probe substance which extends in the direction of the magnetic field, in particular, one in which a known probe fluid is located in as narrow a probe tube as possible, a sample can be arranged at a radial separation from the probe substance, said sample having a small extension in the direction of the probe tube also with respect to the axial extension of the HF resonance structure, such that the sample within the measurement region of the HF resonance structure effects a calculable change in the field strength along the axial extent of the probe substance, said axial extent being coincident with the direction of the magnetic field, with said field strength change being dependent on the susceptibility of said sample.

We claim:

1. In a method for determining a magnetic susceptibility of a material sample in which a first time-invariant, spatially-homogeneous magnetic field is generated in an NMR spectrometer measurement region which is enclosed by a high-frequency resonance system, the sample and a probe substance with a known NMR spectrum are placed in the measurement region and the sample is located relative to the probe substance so that a portion of the probe substance is exposed to a second magnetic field resulting from the modification of the first magnetic field by the magnetic susceptibility of the sample, the probe substance is excited by the high-frequency resonance system to generate a probe substance resonance line with a line width and a line structure, a spectrum of the probe substance is recorded, and a magnetic susceptibility of the sample is determined, an improvement comprising the steps of:
A. forming the probe substance into a column having an axis;
B. arranging the sample in the measurement region physically adjacent to the probe substance column so that the second magnetic field extends over a section of the column and causes changes in the probe substance resonance line width and line structure which changes depend on the position and the size of the sample; and
C. using the probe substance resonance line changes to determine a magnetic susceptibility of the sample.

2. In a method according to claim 1, the improvement wherein step B comprises the steps of:
B1. forming the sample into a ring; and
B2. arranging the sample ring around, but separated from, the probe substance column.

3. In a method according to claim 1, the improvement wherein the probe substance is a solution comprised of a maximum of 50% chloroform and 1% tetramethylsilane in acetone-d6.

4. In a method according to claim 1, the improvement wherein step A comprises the step of:
A1. rotating the probe substance column about the axis during the recording of the probe substance spectrum.

5. In a method according to claim 1 wherein the high-frequency resonance system has a mid-plane, the improvement wherein step B comprises the steps of:
B3. physically locating the sample substantially at the mid-plane of the high-frequency resonance system with the probe substance column axis perpendicular to the high-frequency resonance system mid-plane.

6. An NMR spectrometer probehead for use in a method for determining a magnetic susceptibility of a material sample in which a first time-invariant, spatially-homogeneous magnetic field having a field direction is generated in an NMR spectrometer measurement region which is enclosed by a high-frequency resonance system, the sample and a probe substance with a known NMR spectrum are placed in the measurement region and located in such a manner that the probe substance enclosed by the high-frequency resonance system is exposed to a second magnetic field resulting from the modification of the spatially-homogeneous magnetic field by the susceptibility of the sample, the probe substance is excited by the high-frequency resonance system to generate a probe substance resonance line with a line width and a line structure, a spectrum of the probe substance is recorded, and a magnetic susceptibility of the sample is determined, the probehead comprising:
a cylindrical probe body formed of the probe substance, the probe body having an axis parallel to the field direction; and
a sample sport for holding the sample physically adjacent to the probe body.

7. An NMR spectrometer probehead according to claim 6, wherein the high-frequency resonance system has a mid-plane, the probe body is positioned with the axis perpendicular to the mid-plane and the sample support physically locates the sample substantially at the high-frequency resonance system mid-plane.

8. An NMR spectrometer probehead according to claim 6, wherein the sample is formed into a ring and the sample support locates the sample ring surrounding, but separated from, the probe body.

9. An NMR spectrometer probehead according to claim 8 wherein the probe body has a diameter and the sample ring has a diameter and the sample ring diameter is at least twice the probe body diameter.

10. An NMR spectrometer probehead according to claim 8, wherein the sample is electrically conducting and the sample ring has at least axial slit to form at least one break in the ring.

11. An NMR spectrometer probehead according to claim 6, further comprising a mechanism for rotating the probe body about the axis.

12. A method for determining a magnetic susceptibility of a material sample with an NMR spectrometer having a measurement region enclosed by a high-frequency resonance system, the method comprising the steps of:
A. generating a first time-invariant, spatially-homogeneous magnetic field having field direction in the NMR spectrometer measurement region;
B. selecting a probe substance with a known NMR resonance line having a line width and lien structure and forming the probe substance into a column having an axis;
C. placing the sample and the probe substance column into the measurement region;
D. arranging the sample in the measurement region physically adjacent to the probe substance column so that a second magnetic field resulting from the modification of the first magnetic field by the susceptibility of the sample extends over a section of the column and causes changes in the probe substance resonance line width and line structure which changes depend on the position and the size of the sample;

E. exciting the probe substance with the high-frequency resonance system to generate a probe substance resonance line with a line width and a line structure;

F. recording a spectrum of the probe substance; and and

G. using the recorded probe substance resonance line changes to determine a magnetic susceptibility of the sample.

13. A method according to claim 12 wherein step D comprises the steps of:
   D1. forming the sample into a ring; and
   D2. arranging the sample ring around, but separated from, the probe substance column.

14. A method according to claim 12 wherein step B comprises the steps of:
   B1. selecting the probe substance to be a solution comprised of a maximum of 50% chloroform and 1% tetramethylsilane in acetone-d6.

15. A method according to claim 12, wherein step C comprises the step of:
   C1. placing the probe substance column in the measurement region with the axis parallel to the field direction.

16. A method according to claim 15, wherein step F further comprises the step of:
   F1. rotating the probe substance column and the sample about the axis during the recording of the probe substance spectrum.

17. A method according to claim 12, wherein step C further comprises the step of:
   C2. forming the sample into a toroidal ring lying in a sample ring plane and mounting the sample ring surrounding the probe substance column with the sample ring plane perpendicular to the axis.

18. A method according to claim 17 wherein the high-frequency resonance system has a mid-plane and wherein step D comprises the steps of:
   D3. positioning the probe substance column with the axis perpendicular to the high-frequency resonance system mid-plane; and
   D4. physically locating the sample ring plane substantially in the mid-plane of the high-frequency resonance system.

19. An NMR spectrometer probehead for use with a method for determining a magnetic susceptibility of a material sample in which a first time-invariant, spatially-homogeneous magnetic field is generated in an NMR spectrometer measurement region which is enclosed by a high-frequency resonance system having a mid-plane, the sample and a probe substance with a known NMR spectrum are placed in the measurement region and the sample is located relative to the probe substance so that a portion of the probe substance is exposed to a second magnetic field resulting from the modification of the first magnetic field by the magnetic susceptibility of the sample, the probe substance is excited by the high-frequency resonance system to generate a probe substance resonance line with a line width and a line structure, a spectrum of the probe substance is recorded, and a magnetic susceptibility of the sample is determine, the probehead comprising:
   a hollow, cylindrical probe body for containing the probe substance, the probe body having a length sufficient to extend through the measurement region; and
   a hollow, cylindrical sample support having a length sufficient to extend through the measurement region; and
   a probe mount for mounting the probe body with the axis parallel to the field direction and for mounting the sample support coaxially with the probe body.

20. An NMR spectrometer probehead according to claim 19 further comprising a mechanism for rotating the probe body, the sample support and the probe mount about the axis.

21. An NMR spectormeter probehead according to claim 19 wherein the probe body has an inner diameter and an outer diameter and the sample support has an inner diameter and an outer diameter and the sample support outer diameter is at least twice the probe body inner diameter.

22. An NMR spectrometer probehead according to claim 19 wherein the sample is formed into a toroidal ring and the probehead further comprises means for mounting the sample ring on the sample support substantially in the mid-plane of the high-frequency resonance system.

23. An NMR spectrometer probehead according to claim 22 wherein the sample is formed of an electrically conducting material and the toroidal sample ring has at least one axial slit to form a break in the ring.

* * * * *